United States Patent
Blin

(10) Patent No.: US 8,213,886 B2
(45) Date of Patent: Jul. 3, 2012

(54) HYBRID TECHNIQUES FOR ANTENNA RETUNING UTILIZING TRANSMIT AND RECEIVE POWER INFORMATION

(75) Inventor: Guillaume Blin, Malden, MA (US)

(73) Assignee: Paratek Microwave, Inc., Wilmington, DE (US)

( * ) Notice: Subject to any disclaimer, the term of this patent is extended or adjusted under 35 U.S.C. 154(b) by 883 days.

(21) Appl. No.: 11/800,592

(22) Filed: May 7, 2007

(65) Prior Publication Data

US 2008/0280570 A1   Nov. 13, 2008

(51) Int. Cl.
*H01Q 11/12* (2006.01)
*H04B 1/04* (2006.01)

(52) U.S. Cl. .......... 455/123; 455/67.11; 455/67.13; 455/68; 455/69; 455/120; 455/121; 455/124; 455/115.1; 455/115.3; 455/193.1; 455/226.1; 455/226.2

(58) Field of Classification Search ............ 455/67.11, 455/67.13–67.16, 68–70, 522, 120–126, 455/115.1–115.4, 226.1–226.4, 193.1, 78–82
See application file for complete search history.

(56) References Cited

U.S. PATENT DOCUMENTS

| | | | |
|---|---|---|---|
| 2,745,067 A | 5/1956 | True | |
| 3,117,279 A | 1/1964 | Ludvigson | |
| 3,160,832 A | 12/1964 | Beitman | |
| 3,390,337 A | 6/1968 | Beitman | |
| 3,443,231 A | 5/1969 | Roza | |
| 3,509,500 A | 4/1970 | McNair | |
| 3,571,716 A | 3/1971 | Hill | |
| 3,590,385 A | 6/1971 | Sabo | |
| 3,601,717 A | 8/1971 | Kuecken | |
| 3,794,941 A | 2/1974 | Templin | |
| 3,919,644 A | 11/1975 | Smolka | |
| 3,990,024 A | 11/1976 | Hou | |
| 3,995,237 A | 11/1976 | Brunner | |
| 4,186,359 A | 1/1980 | Kaegebein | |
| 4,201,960 A | 5/1980 | Skutta | |
| 4,227,256 A | 10/1980 | O'Keefe | |
| 4,383,441 A | 5/1983 | Willis | |
| 4,493,112 A | 1/1985 | Bruene | |
| 4,777,490 A | 10/1988 | Sharma | |
| 4,799,066 A | 1/1989 | Deacon | |
| 4,965,607 A * | 10/1990 | Wilkins et al. | 343/861 |
| 5,032,805 A | 7/1991 | Elmer | |

(Continued)

FOREIGN PATENT DOCUMENTS

DE   19614655   10/1997

(Continued)

OTHER PUBLICATIONS

International Search Report Dated Jul. 8, 2008.

(Continued)

*Primary Examiner* — Tuan A Tran
(74) *Attorney, Agent, or Firm* — Guntin Meles & Gust, PLC; Andrew Gust

(57) ABSTRACT

An embodiment of the present invention provides an apparatus, comprising a transceiver, an antenna tuner connecting the transceiver to an antenna, a power sensor adapted to acquire measurements about transmit power, a receive signal strength indicator (RSSI) adapted to acquire measurements about receive power and wherein the tuner tunes the antenna based upon the transmit and receive measurements to optimize the antenna in both the receive and transmit bands.

15 Claims, 4 Drawing Sheets

U.S. PATENT DOCUMENTS

| | | | |
|---|---|---|---|
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,243,358 A | 9/1993 | Sanford |
| 5,258,728 A | 11/1993 | Taniyoshi |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,561,407 A | 10/1996 | Koscica |
| 5,564,086 A | 10/1996 | Cygan |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,766,697 A | 6/1998 | Sengupta |
| 5,778,308 A | 7/1998 | Sroka |
| 5,786,727 A | 7/1998 | Sigmon |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,929,717 A | 7/1999 | Richardson |
| 5,963,871 A | 10/1999 | Zhinong |
| 5,969,582 A | 10/1999 | Boesch |
| 5,990,766 A | 11/1999 | Zhang |
| 6,009,124 A | 12/1999 | Smith |
| 6,020,787 A | 2/2000 | Kim |
| 6,029,075 A | 2/2000 | Das |
| 6,045,932 A | 4/2000 | Jia |
| 6,061,025 A | 5/2000 | Jackson |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,133,883 A | 10/2000 | Munson |
| 6,172,385 B1 | 1/2001 | Duncombe |
| 6,215,644 B1 | 4/2001 | Dhuler |
| 6,281,847 B1 | 8/2001 | Lee |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,556,814 B1 | 4/2003 | Klomsdorf |
| 6,570,462 B2 | 5/2003 | Edmonson |
| 6,590,468 B2 | 7/2003 | du Toit et al. |
| 6,590,541 B1 | 7/2003 | Schultze |
| 6,597,265 B2 | 7/2003 | Liang |
| 6,608,603 B2 | 8/2003 | Alexopoulos |
| 6,624,786 B2 | 9/2003 | Boyle |
| 6,657,595 B1 | 12/2003 | Phillips et al. |
| 6,661,638 B2 | 12/2003 | Jackson et al. |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,759,918 B2 | 7/2004 | Du Toit |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,888,714 B2 | 5/2005 | Shaw |
| 6,905,989 B2 | 6/2005 | Ellis |
| 6,907,234 B2 | 6/2005 | Karr |
| 6,920,315 B1 | 7/2005 | Wilcox |
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent |
| 6,964,296 B2 | 11/2005 | Memory |
| 6,965,837 B2 | 11/2005 | Vintola |
| 6,993,297 B2 | 1/2006 | Smith |
| 7,009,455 B2 | 3/2006 | Toncich |
| 7,071,776 B2 | 7/2006 | Forrester |
| 7,107,033 B2 | 9/2006 | D du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,426,373 B2 | 9/2008 | Clingman |
| 7,468,638 B1 * | 12/2008 | Tsai et al. ............... 331/126 |
| 7,535,312 B2 | 5/2009 | McKinzie |
| 7,539,527 B2 * | 5/2009 | Jang et al. ............ 455/575.3 |
| 7,596,357 B2 * | 9/2009 | Nakamata et al. .......... 455/78 |
| 7,667,663 B2 | 2/2010 | Hsiao |
| 7,714,616 B2 | 5/2010 | Kimura |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0193997 A1 | 10/2003 | Dent |
| 2003/0232607 A1 * | 12/2003 | Le Bars et al. ............ 455/126 |
| 2004/0009754 A1 * | 1/2004 | Smith, Jr. .................. 455/82 |
| 2004/0137950 A1 | 7/2004 | Bolin |
| 2004/0202399 A1 | 10/2004 | Kochergin |
| 2004/0257293 A1 | 12/2004 | Friedrich |
| 2005/0032488 A1 | 2/2005 | Pehlke |
| 2005/0042994 A1 | 2/2005 | Otaka |
| 2005/0059362 A1 | 3/2005 | Kalajo |
| 2005/0082636 A1 | 4/2005 | Yashima |
| 2005/0093624 A1 | 5/2005 | Forrester |

| | | | |
|---|---|---|---|
| 2005/0130608 | A1 | 6/2005 | Forse |
| 2005/0215204 | A1 | 9/2005 | Wallace |
| 2005/0282503 | A1 | 12/2005 | Onno |
| 2006/0003537 | A1 | 1/2006 | Sinha |
| 2006/0009165 | A1* | 1/2006 | Alles .............................. 455/88 |
| 2006/0160501 | A1 | 7/2006 | Mendolia |
| 2006/0183433 | A1 | 8/2006 | Mori |
| 2006/0183442 | A1 | 8/2006 | Chang |
| 2006/0281423 | A1 | 12/2006 | Caimi |
| 2007/0013483 | A1 | 1/2007 | Stewart |
| 2007/0042734 | A1 | 2/2007 | Ryu |
| 2007/0080888 | A1 | 4/2007 | Mohamadi |
| 2007/0085609 | A1 | 4/2007 | Itkin |
| 2007/0142014 | A1 | 6/2007 | Wilcox |
| 2007/0149146 | A1 | 6/2007 | Hwang |
| 2007/0197180 | A1 | 8/2007 | McKinzie |
| 2008/0055016 | A1 | 3/2008 | Morris |
| 2008/0122553 | A1 | 5/2008 | McKinzie |
| 2008/0122723 | A1 | 5/2008 | Rofougaran |
| 2008/0158076 | A1 | 7/2008 | Walley |
| 2008/0274706 | A1 | 11/2008 | Blin |
| 2009/0109880 | A1 | 4/2009 | Kim |
| 2009/0149136 | A1 | 6/2009 | Rofougaran |
| 2010/0085260 | A1 | 4/2010 | McKinzie |
| 2010/0156552 | A1 | 6/2010 | McKinzie |

FOREIGN PATENT DOCUMENTS

| | | |
|---|---|---|
| EP | 0685936 | 6/1995 |
| EP | 0909024 | 9/1998 |
| EP | 1137192 | 9/2001 |
| EP | 1298810 | 4/2006 |
| JP | 03276901 | 3/1990 |
| JP | 10209722 | 8/1998 |
| WO | WO-2009/064968 | 5/2009 |
| WO | WO-2011/044592 | 4/2011 |
| WO | WO-2011/133657 | 10/2011 |
| WO | WO-2011028453 | 10/2011 |

OTHER PUBLICATIONS

Hyun, S. , "Effects of strain on the dielectric properties of tunable dielectric SrTi03 thin films", Applied Physics Letters, 2004 American Institute of Physics.

Ida, I. et al., "An Adaptive Impedence Matching System and Its Application to Mobile Antennas", TENCON 2004, IEEE Region 10 Conference, See Abstract ad p. 544, Nov. 21-24, 2004, 543-547.

Patent Cooperation Treaty, "International Search Report and Written Opinion", International Application No. PCT/US2010/046241, Mar. 2, 2011.

Patent Cooperation Treaty, "International Search Report and Written Opinion", PCT Application No. PCT/US08/005085, Jul. 2, 2008.

Pervez, N.K. , "High Tunability barium strontium titanate thin films for RF circuit applications", Applied Physics Letters, 2004 American Institute of Physics.

Qiao, et al., "Antenna Impedance Mismatch Measurement and Correction for Adaptive COMA Transceivers", IEEE, 2005.

Qiao, et al., "Measurement of Antenna Load Impedance for Power Amplifiers", The Department of Electrical and Computer Engineering, University of California, San Diego, Sep. 13, 2004.

Stemmer, Susanne , "Low-loss tunable capacitors fabricated directly on gold bottom electrodes", University of California Postprints 2006.

Taylor, T.R. , "Impact of thermal strain on the dielectric constant of sputtered barium strontium titanate thin films", Applied Physics Letters, 2002 American Institute of Physics, Mar. 2002.

Tombak, Ali , Tunable Barium Strontium Titanate Thin Film Capacitors for RF and Microwave Applications. IEEE Microwave and Wireles Components Letters, vol. 12, Jan. 2002.

Xu, Hongtao , "Tunable Microwave Integrated Circuits using BST Thin Film Capacitors with Device", Integrated Ferroelectrics, Department of Electrical Engineering and Computer Engineering, University of California, 2005.

Du Toit, "Tunable Microwave Devices With Auto Adjusting Matching Circuit", U.S. Appl. No. 13/302,617, filed Nov. 22, 2011.

Du Toit, "Tunable Microwave Devices with Auto-Adjusting Matching Circuit", U.S. Appl. No. 13/302,649, filed Nov. 22, 2011.

Greene, "Method and Apparatus for Tuning a Communication Device", U.S. Appl. No. 13/108,463, filed May 16, 2011.

Greene, "Method and Apparatus for Tuning a Communication Device", U.S. Appl. No. 13/108,589, filed May 16, 2011.

Hoirup, "Method and Apparatus for Radio Antenna Frequency Tuning", U.S. Appl. No. 13/030,177, filed Feb. 18, 2011.

Manssen, "Method and Apparatus for Managing Interference in a Communication Device", U.S. Appl. No. 61/326,206, filed Apr. 20, 2010.

Manssen, "Method and Apparatus for Tuning Antennas in a Communication Device", U.S. Appl. No. 12/941,972, filed Nov. 18, 2010.

Manssen, "Method and Apparatus for Tuning Antennas in a Communication Device", U.S. Appl. No. 13/005,122, filed Jan. 12, 2011.

McKinzie, "Adaptive Impedance Matching Module (AIMM) Control Architectures", U.S. Appl. No. 13/293,544, filed Nov. 10, 2011.

McKinzie, "Adaptive Impedance Matching Module (AIMM) Control Architectures", U.S. Appl. No. 13/293,550, filed Nov. 10, 2011.

McKinzie, "Method and Apparatus for Adaptive Impedance Matching", U.S. Appl. No. 13/217,748, filed Aug. 25, 2011.

Mendolia, "Method and Apparatus for Tuning a Communication Device", U.S. Appl. No. 13/035,417, filed Feb. 25, 2011.

Paratek Microwave, Inc., "Method and Apparatus for Tuning Antennas in a Communication Device", International Application No. PCT/US11/59620, filed Nov. 7, 2011.

Patent Cooperation Treaty, "International Search Report and Written Opinion", International Application No. PCT/US2010/056413, Jul. 27, 2011.

Spears, "Methods for Tuning an Adaptive Impedance Matching Network with a Look-up Table", U.S. Appl. No. 13/297,951, filed Nov. 16, 2011.

* cited by examiner

HYBRID TECHNIQUES FOR ANTENNA RETUNING UTILIZING TRANSMIT AND RECEIVE POWER INFORMATION

BACKGROUND OF THE INVENTION

Wireless devices have become prevalent throughout society. As users demand more mobility, there is a tremendous requirement for decreasing power consumption and thereby increasing battery life. Further, many wireless devices may transmit on a plurality of carrier frequencies and include circuits dealing with several frequency bands of operation and may receive and transmit at varying power levels. In wireless applications, the transmitted power is much higher than the received power and to perform the retuning of a mismatched antenna or matching network, power measurement must be performed.

Thus, there is a strong need for techniques for antenna retuning utilizing transmit and receive power information.

SUMMARY OF THE INVENTION

An embodiment of the present invention provides an apparatus, comprising a transceiver, an antenna tuner connecting the transceiver to an antenna, a power sensor adapted to acquire measurements about transmit power, a receive signal strength indicator (RSSI) adapted to acquire measurements about receive power and wherein the tuner tunes the antenna based upon the transmit and receive measurements to optimize the antenna in both the receive and transmit bands.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Figure 1:
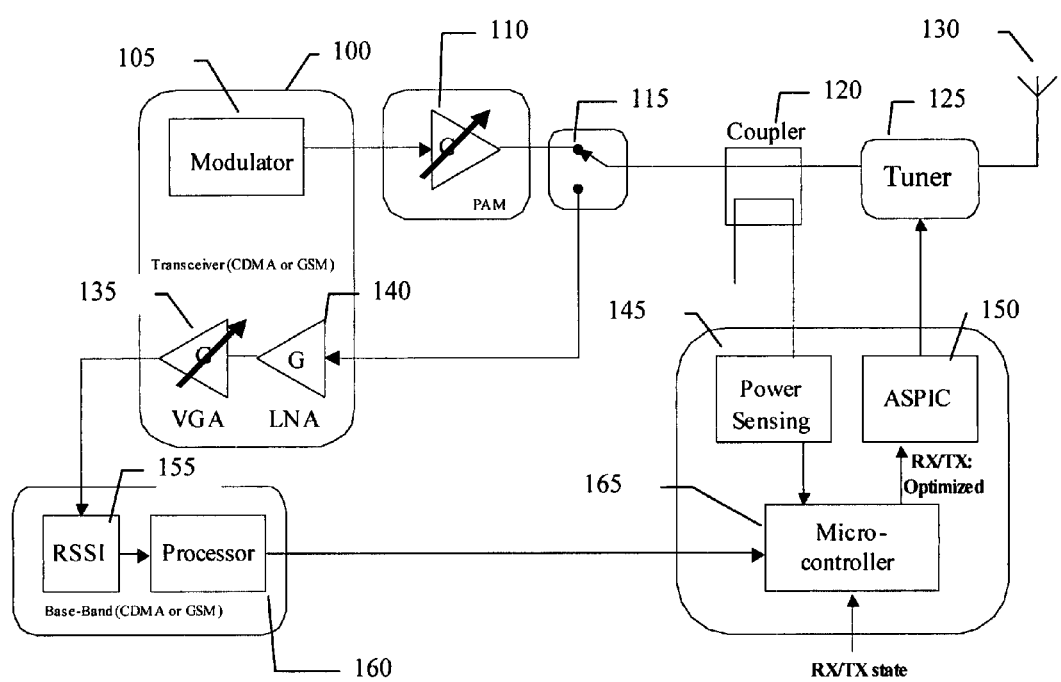
FIG. 1 illustrates an apparatus adapted for transmit and receive fully closed loop power measurements and antenna retuning of an embodiment of the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

Turning to FIG. 1, is an apparatus, comprising a transceiver 100, an antenna tuner 125 connecting the transceiver 100 to an antenna 130, a power sensor 145 adapted to acquire measurements about transmit power, a receive signal strength indicator (RSSI) 155 adapted to acquire measurements about receive power, and wherein the tuner 125 tunes the antenna 130 based upon the transmit and receive measurements to optimize the antenna 130 in both the receive and transmit bands.

In an embodiment of the present invention, the transceiver may further comprise a modulator 105 driving a variable power amplifier module (PAM) 110 and a low noise amplifier 140 adapted to receive the output of the variable PAM 110 via a switch 115, and a variable gain amplifier (VGA) 135 receiving the output of the low noise amplifier 140. The RSSI may receive the output of the VGA and output it to a processor 160, thereby providing the receive sense for the receive signal measurements. The output of the PAM 110 may be coupled via a coupler. 120 and switch 115 to the power sensor 145 to determine the transmit measurements. In an embodiment of the present invention the apparatus may further comprise a microcontroller 165 adapted to received transmit measurements from the power sensor 145 and receive measurements from the RSSI 155 via a processor 160 and pass this information to an application specific programmable integrated circuit (ASPIC) 150 to control the tuner 125.

Figure 2:
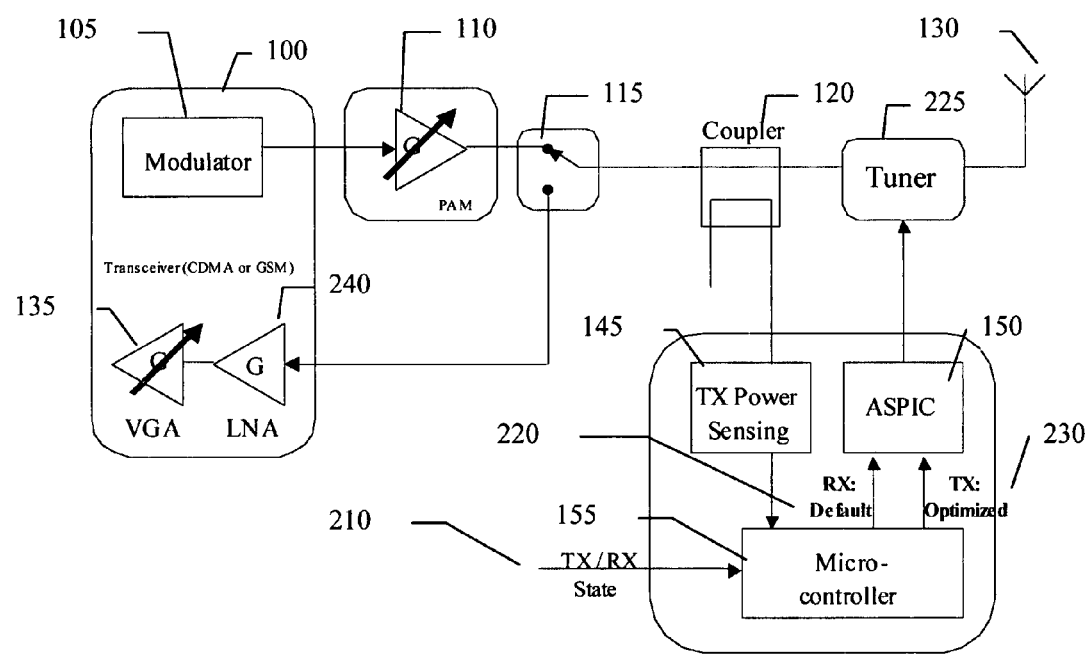
FIG. 2 illustrates an apparatus adapted for transmit and receive one half closed loop power measurements and antenna retuning of an embodiment of the present invention.
Figure 3:
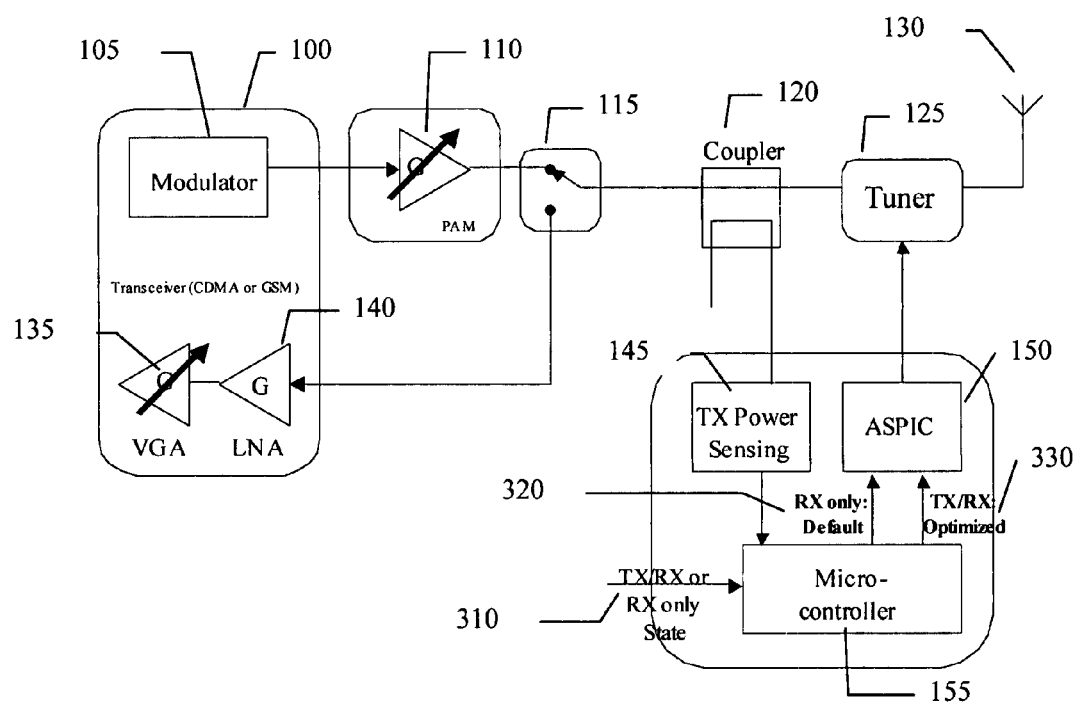
FIG. 3 illustrates an apparatus adapted for transmit and receive three quarters closed loop power measurements and antenna retuning of an embodiment of the present invention.

Turning now to FIG. 2, a base-band may specify to the microcontroller 155 the transmit and receive state 210. Further, the apparatus of FIG. 2 illustrates the microcontroller may transmit to the ASPIC either a default received state 220 only or an optimized transmit or receive state 230 based on a base-band specification FIG. 3, illustrates the base-band specifying to the microcontroller the transmit and receive state or receive state only 310. The microcontroller 155 of FIG. 3 may transmit to the ASPIC either a receive default state only 320 or an optimized transmit state based on a base-band specification 330.

Figure 4:
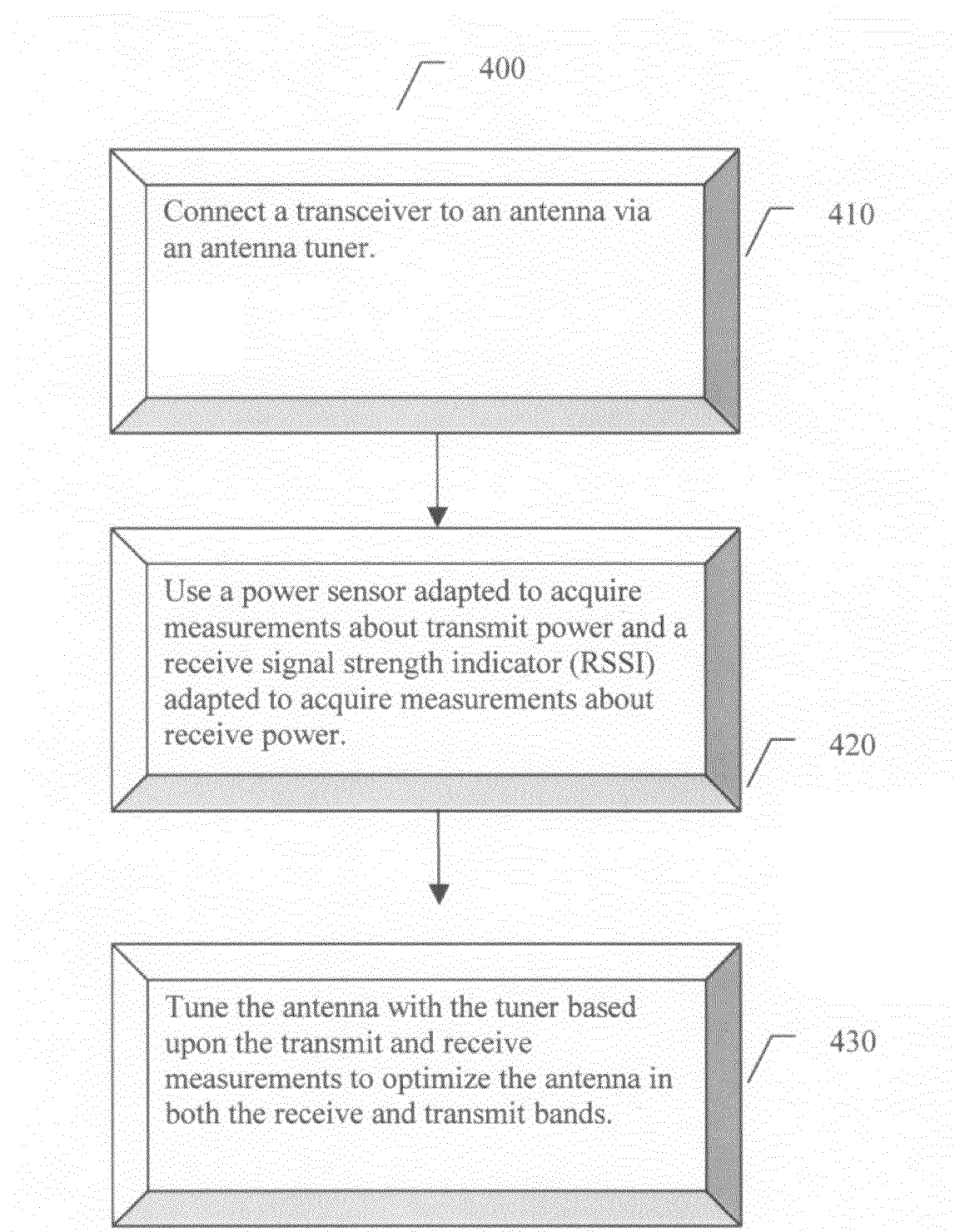
FIG. 4 illustrates a method according to one embodiment of the present invention.

Turning now to FIG. 4, shown generally as 400, is a method according to an embodiment of the present invention, comprising connecting a transceiver to an antenna via an antenna tuner 410, using a power sensor adapted to acquire measurements about transmit power and a receive signal strength indicator (RSSI) adapted to acquire measurements about receive power 420 and tuning the antenna with the tuner based upon the transmit and receive measurements to optimize the antenna in both the receive and transmit bands 430. An embodiment of the present method may further comprise using a modulator driving a power amplifier module (PAM), a low noise amplifier adapted to receive the output of the PAM via a switch, and a variable gain amplifier (VGA) receiving the output of the low noise amplifier in the transceiver. Also, the present method may further comprise receiving the output of the VGA by the RSSI and outputting to a processor, thereby providing the receive sense for the receive signal measurements and coupling the output of the PAM via a coupler and switch to the power sensor to determine the transmit measurements. An embodiment of the present method may further comprise using a microcontroller adapted to received transmit measurements from the power sensor and receive measurements from the RSSI via a processor and passing this information to an application specific programmable integrated circuit (ASPIC) to control the tuner.

Specifying by a base-band to the microcontroller the transmit and receive state or specifying by a base-band to the microcontroller the transmit and receive state or receive state only may also be included in some embodiments of the present invention. In still a further embodiment, the present method may further comprise transmitting by the microcontroller to the ASPIC either a default received state only or an optimized transmit or receive state based on a base-band specification.

Some embodiments of the present invention may be implemented, for example, using a machine-readable medium or article which may store an instruction or a set of instructions that, if executed by a machine, for example, by the microcontroller 130 or ASPIC 135 of FIG. 1, or by other suitable machines, cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Re-Writeable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like.

In an embodiment of the present invention the machine-accessible medium that provides instructions, which when accessed, may cause the machine to perform operations comprising connecting a transceiver to an antenna via an antenna tuner, using a power sensor adapted to acquire measurements about transmit power and a receive signal strength indicator (RSSI) adapted to acquire measurements about receive power, and tuning the antenna with the tuner based upon the transmit and receive measurements to optimize the antenna in both the receive and transmit bands. The machine-accessible medium of the present invention may further comprise the instructions causing the machine to perform operations further comprising using a modulator driving a power amplifier module (PAM), a low noise amplifier adapted to receive the output of the PAM via a switch, and a variable gain amplifier (VGA) receiving the output of the low noise amplifier in the transceiver. The machine-accessible medium of the present invention yet still may further comprise the instructions causing the machine to perform operations further comprising receiving the output of the VGA by the RSSI and outputting to a processor, thereby providing the receive sense for the receive signal measurements and still further comprise the instructions causing the machine to perform operations further comprising coupling the output of the PAM via a coupler and switch to the power sensor to determine the transmit measurements and using a microcontroller adapted to received transmit measurements from the power sensor and receive measurements from the RSSI via a processor and passing this information to an application specific programmable integrated circuit (ASPIC) to control the tuner.

Some embodiments of the present invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors or controllers, or devices as are known in the art. Some embodiments of the invention may include buffers, registers, stacks, storage units and/or memory units, for temporary or long-term storage of data or in order to facilitate the operation of a specific embodiment.

Regarding the timing for retuning, in an embodiment of the present invention the antenna retuning may occur once per frame, before the burst. In this case power is measured and averaged on the previous burst, the calculation of next biasing points is performed and new values are applied for the following burst. This has the advantages of a lot of time to compute, power savings, no transients issues (spurious), fast enough for humans (~100 ms for retuning).

While the present invention has been described in terms of what are at present believed to be its preferred embodiments, those skilled in the art will recognize that various modifications to the disclose embodiments can be made without departing from the scope of the invention as defined by the following claims.

What is claimed is:

1. A method, comprising:
using a power sensor adapted to acquire measurements about transmit power during a first burst transmission;
using a receive signal strength indicator (RSSI) adapted to acquire measurements about receive power; and
tuning an antenna coupled with a transceiver using a tuner once per frame prior to a second burst transmission based upon said transmit and receive measurements to improve said antenna in both the receive and transmit bands, wherein both the transmit and receive measurements are simultaneously utilized in determining the tuning, and wherein the second burst transmission follows the first burst transmission in time.

2. The method of claim 1, further comprising:
using a modulator driving a power amplifier module (PAM), a low noise amplifier adapted to receive the output of said PAM via a switch, and a variable gain amplifier (VGA) receiving the output of said low noise amplifier in said transceiver.

3. The method of claim 2, further comprising receiving the output of said VGA by said RSSI and outputting to a processor, thereby providing the receive sense for said receive signal measurements.

4. The method of claim 3, further comprising coupling the output of said PAM via a coupler and switch to said power sensor to determine the transmit measurements.

5. The method of claim 4, further comprising using a microcontroller adapted to received transmit measurements from said power sensor and receive measurements from said RSSI via a processor and passing this information to an application specific programmable integrated circuit (ASPIC) to control said tuner.

6. The method of claim 5, further comprising specifying by a base-band to said microcontroller the transmit and receive state.

7. The method of claim 5, further comprising specifying by a base-band to said microcontroller the transmit and receive state or receive state only.

8. The method of claim 5, further comprising transmitting by said microcontroller to said ASPIC either a default received state only or an optimized transmit or receive state based on a base-band specification.

9. A machine-accessible medium that provides instructions, which when accessed, cause a machine to perform operations comprising:

using a power sensor adapted to acquire measurements about transmit power during a first burst transmission;
using a receive signal strength indicator (RSSI) adapted to acquire measurements about receive power; and
tuning an antenna coupled with a transceiver using a tuner based upon said transmit and receive measurements to improve said antenna in both the receive and transmit bands, wherein both the transmit and receive measurements are simultaneously utilized in determining the tuning, wherein the tuning is performed once per frame, wherein the tuning is performed prior to a second burst transmission, and wherein the second burst transmission follows the first burst transmission in time.

10. The machine-accessible medium of claim 9, further comprising said instructions causing said machine to perform operations further comprising using a modulator driving a power amplifier module (PAM), a low noise amplifier adapted to receive the output of said PAM via a switch, and a variable gain amplifier (VGA) receiving the output of said low noise amplifier in said transceiver.

11. The machine-accessible medium of claim 10, further comprising said instructions causing said machine to perform operations further comprising receiving the output of said VGA by said RSSI and outputting to a processor, thereby providing the receive sense for said receive signal measurements.

12. The machine-accessible medium of claim 11, further comprising said instructions causing said machine to perform operations further comprising coupling the output of said PAM via a coupler and switch to said power sensor to determine the transmit measurements.

13. The machine-accessible medium of claim 12, further comprising said instructions causing said machine to perform operations further comprising a microcontroller adapted to received transmit measurements from said power sensor and receive measurements from said RSSI via a processor and passing this information to an application specific programmable integrated circuit (ASPIC) to control said tuner.

14. The machine-accessible medium of claim 13, further comprising said instructions causing said machine to perform operations further comprising specifying by a base-band to said microcontroller the transmit and receive state or receive state only.

15. The machine-accessible medium of claim 13, further comprising said instructions causing said machine to perform operations further comprising transmitting by said microcontroller to said ASPIC either a default received state only or an optimized transmit or receive state based on a base-band specification.

* * * * *